United States Patent [19]

Rawls et al.

[11] Patent Number: 4,785,345

[45] Date of Patent: Nov. 15, 1988

[54] INTEGRATED TRANSFORMER STRUCTURE WITH PRIMARY WINDING IN SUBSTRATE

[75] Inventors: Spencer A. Rawls, Reading; Luke J. Turgeon, Westlawn, both of Pa.

[73] Assignee: American Telephone and Telegraph Co., AT&T Bell Labs., Murray Hill, N.J.

[21] Appl. No.: 860,858

[22] Filed: May 8, 1986

[51] Int. Cl.⁴ .................. H01L 29/34; H01L 27/02; H01L 23/30; H01F 5/00
[52] U.S. Cl. .................................. 357/51; 357/54; 357/73; 336/200; 336/220; 336/232
[58] Field of Search .................. 357/51, 54, 73; 336/200, 220, 232

[56] References Cited

U.S. PATENT DOCUMENTS

| | | | |
|---|---|---|---|
| 3,848,210 | 11/1974 | Felkner | 336/232 |
| 4,103,267 | 7/1978 | Olschewski | 336/65 |
| 4,183,074 | 1/1980 | Wallace | 336/200 |
| 4,249,229 | 2/1981 | Hester | 361/399 |
| 4,482,874 | 11/1984 | Rubertus et al. | 336/232 |
| 4,494,100 | 1/1985 | Stengel et al. | 336/200 |
| 4,547,961 | 10/1985 | Bokil et al. | 336/200 |
| 4,555,291 | 11/1985 | Tait et al. | 336/200 |

Primary Examiner—Martin H. Edlow
Assistant Examiner—David R. Josephs
Attorney, Agent, or Firm—Wendy W. Koba

[57] ABSTRACT

An integrated transformer structure is disclosed. In one embodiment, the primary transformer winding is formed using dielectrically isolated (DI) technology so as to isolate high voltages applied to the transformer primary from other components in the substrate. Alternatively, conventional junction isolated technology may be used, where physical separation between the integrated transformer and other components may be provided. In accordance with the present invention, the primary winding comprises a planar spiral formed with a low-resistivity material and incorporated with the substrate. An insulating layer is then formed over the primary winding. A planar spiral configuration is also used to form the secondary winding, where the secondary may be formed of a deposited metal and is formed on top of the insulating layer so as to be directly above the primary winding. The result is an effective air-core transformer structure capable of isolating thousands of volts.

12 Claims, 3 Drawing Sheets

INTEGRATED TRANSFORMER STRUCTURE WITH PRIMARY WINDING IN SUBSTRATE

BACKGROUND OF THE INVENTION

1. Field of the Invention

The present invention relates to an integrated transformer structure and, more particularly, to an integrated transformer which can be formed on a single silicon chip and is capable of providing high-voltage isolation between input and output signals.

2. Description of the Prior Art

In the current world of semiconductor electronics, the need for ever-smaller components is constantly increasing. Unlike many other standard electrical components, the miniaturization of the transformer has proven to be a difficult task. For example, conventional wound transformers are difficult to make in small sizes, especially since the windings are typically made of very tiny wire. A miniaturized transformer of this structure is disclosed in U.S. Pat. No. 4,103,267 issued to W. W. Olschewski on July 25, 1978. In this device, a ceramic substrate is provided with a plurality of planar conductors which extend radially from an imaginary point on the surface of the substrate. A layer of dielectric material is formed over a major portion of each of the conductors to form a ring of dielectric material to which a ferrite toroidal core is adhesively secured. The core is precoated with an insulating material prior to being secured to the dielectric ring. A plurality of wire conductors are wire bonded at each end thereof to the exposed ends of the metal conductors on the substrate. Although this structure is significantly smaller than a conventional ferrite core transformer, its use is limited to hybrid component manufacture, and as disclosed cannot be totally integrated into the ceramic substrate.

An improvement over the Olschewski arrangement is disclosed in U.S. Pat. No. 4,547,961 issued to D. R. Bokil et al on Oct. 22, 1985. The Bokil et al patent discloses a miniaturized thick-film isolation transformer. In particular, the arrangement includes two rectangular substrates, each carrying successive screen-printed thick-film layers of dielectric with embedded spiral planar windings. The substrates and the dielectric layers are formed with a central opening in which is positioned the central leg of a three-legged solid magnetic core. The remaining portions of the core surround the two substrates. Although this arrangement is relatively small in size (0.75"×0.55" with a height of 0.2"), it is still too large to be formed on a silicon substate and integrated with other components.

The problem remaining in the prior art, therefore, is to provide a completely integrated transformer capable of being formed on a single silicon substrate which is able to provide the isolation required for high voltage integrated circuit applications.

SUMMARY OF THE INVENTION

The problem remaining in the prior art has been solved in accordance with the present invention which relates to an integrated transformer structure and, more particularly, to such a transformer which can be formed on a single silicon chip and is capable of providing high voltage isolation between input and output signals.

It is an aspect of the present invention to utilize planar conducting loops, separated by a dielectric material, as the primary and secondary windings of the transformer.

Another aspect of the present invention is to utilize a dielectrically isolated (DI) tub filled with low resistivity silicon to form one winding of the transformer, where the DI formation will function to isolate the transformer winding from the conductive substrate region.

Yet another aspect of the present invention is to form a fully integrated transformer usin junction isolated processing techniques, where two separate substrates are used to provide spatial isolation between input and the output circuitry, while still providing a relatively small package to house both the transformer and its associated circuitry.

Other and further aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
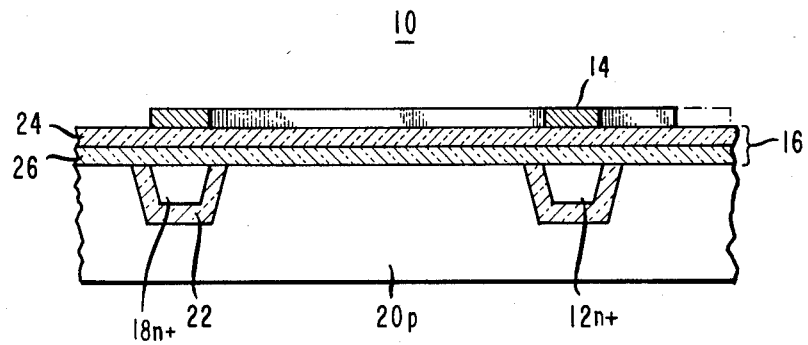
FIG. 1 illustrates a partial side view of an integrated transformer formed in accordance with the present invention which comprises a single primary winding and a single secondary winding, the primary being formed in a dielectrically isolated tub.

An advantage of the monolithic transformer structure of the present invention, as will be described in detail below, is its usefulness in providing high voltage isolation between separate portions of a single silicon chip. Currently, optical couplers are the most commonly used method of achieving high voltage isolation. Optical isolators consist of light emitting diode and phototransistor pairs. Additional circuitry to drive the opto-isolator and recover the signal from the photo transistor is needed on separate integrated circuits. This type of arrangement results in requiring a significant number of separate components which add to both the complexity and size of the circuit. Furthermore, opto-isolators are often band-limited to <100 KHz. Voltage isolation can also be achieved with the use of capacitors, but capacitors become very large (for a fixed capacitance) when needed to block high voltages (on the order of a thousand volts) and are not a preferable form of isolation since they cannot block high voltage transients.

The integrated transformer of the present invention, in contrast, will pass only high frequency ac current and its area is independent of the required voltage isolation. One exemplary integrated transformer 10 of the present invention is illustrated in FIG. 1.

Transformer 10 comprises a planar primary winding 12 and a planar secondary winding 14 separated by a dielectric region 16. Primary winding 12, for the exemplary arrangement shown in FIG. 1, includes a single turn winding formed by a deep n+ diffusion ring 18 (which has a resistance of only 1-2 ohm/square, and is therefore sufficiently conductive) isolated from semiconductor substrate 20 by a dielectric 22, where this dielectric may simply comprise a layer of silicon dioxide. This type of isolatin, is well-known in art and is used in the formation of high voltage devices, as described in U.S. Pat. No. 4,242,697 entitled "Dielectrically Isolated High Voltage Semiconductor Devices", issued to J. E. Berthold et al on Dec. 30, 1980. In the formation of the present monolithic transformer structure, dielectric isolation is required due to the conductive nature of substrate 20. Without dielectric layer 22, a sufficiently large voltage applied to primary 12 would cause substrate 20 to break down and become a signal path between primary 12 and integrated components formed in substrate 20 connected to secondary 14 (not shown). Well-known processing techniques used to form dielectrically isolated tubs for high voltage integrated circuit applications, as described in the above-cited Berthold et al patent, may be used to form primary 12. Dielectric region 16 is also formed using standard techniques. For example, region 16 may comprise a first layer 24 of grown silicon dioxide and a second layer 26 of deposited phosphorous-doped silica glass, where layer 26 is deposited to a predetermined thickness such that the combined thickness of layers 24 and 26 is sufficient to provide the required isolation between primary 12 and secondary 14. For the embodiment illustrated in FIG. 1, secondary winding 14 also comprises a single turn and is formed to be aligned with primary 12 in the vertical direction. Secondary winding 14 may comprises any metal or other conductive material, aluminum being one such material. Standard lithographic techniques, well-known in the art, may be utilized to form the desired pattern for secondary 14, where for this particular embodiment, a single loop is used.

A typical arrangement as illustrated in FIG. 1 may provide isolation of up to, for example, 500 V between a signal $V_{IN}$ applied to primary 12 and a signal $V_{OUT}$ induced in secondary 14, with a dielectric region 16 of approximately 2-4 $\mu$m in thickness. As used, diffusion n+ 18 of primary 12 is on the order of 10 $\mu$m deep and 10 $\mu$m wide, where secondary 14 also comprises a width of approximately 10 $\mu$m.

Figure 2:
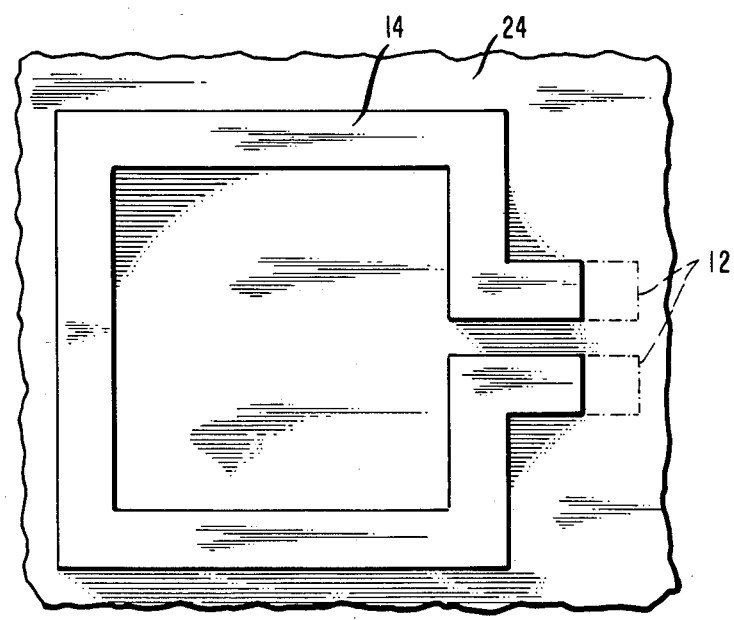
FIG. 2 is a top view of the exemplary arrangement of FIG. 1.

A top view of transformer 10 is shown in FIG. 2, which clearly illustrates the formation of secondary winding 14 over second layer 24 of dielectric region 16. As shown, the single turn winding of secondary 14 is formed in a square, with a 1 mm diameter. As stated above, the width of secondary winding 14 for this exemplary arrangement is 10 $\mu$m. It is to be understood that various other geometries may be used to form the single turn configuration, for example, a circle or a rectangle may also be employed. Although not shown in FIG. 2, primary 12, which lies beneath dielectric 16, is formed to comprise a similar geometry as secondary 14, where it is obvious that the degree of vertical alignment between the two winding layouts is directly related to the amount of coupling between $V_{IN}$ and $V_{OUT}$.

Figure 3:
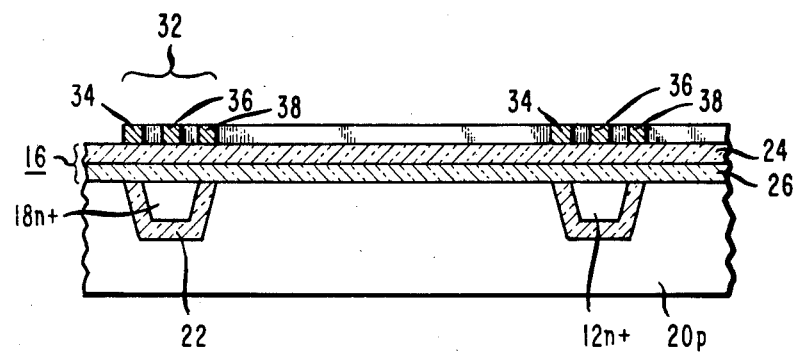
FIG. 3 illustrates a partial side view of an alternative structure of the present invention formed using dielectric isolation with a three-turn secondary transformer winding.
Figure 4:
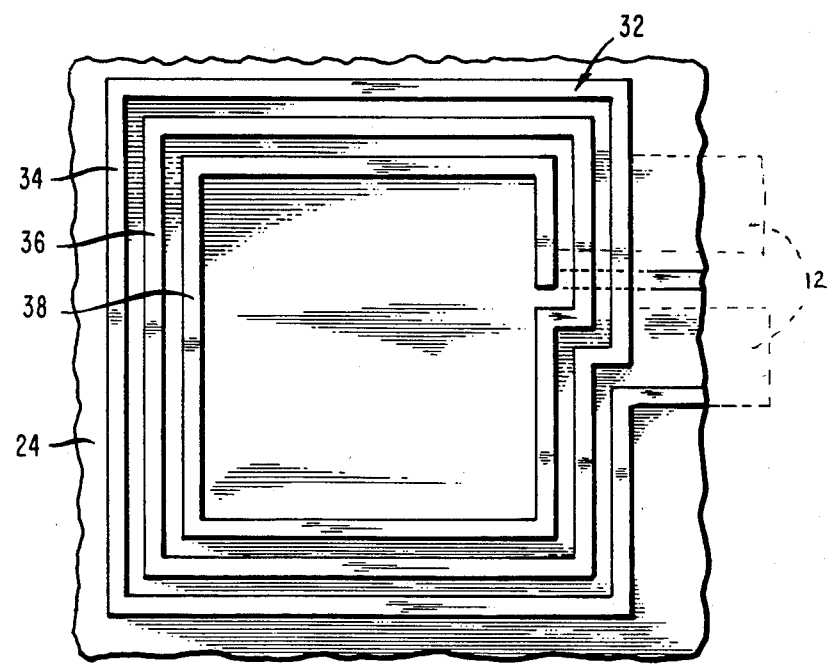
FIG. 4 is a top view of the arrangement of FIG. 3.

In accordance with the present invention, a monolithic integrated transformer may be formed which comprises an appropriate number of primary and secondary turns. As is well-known in the design of discrete transformers, an integrated transformer structure of the present invention which comprises a greater number of secondary turns ($n_2$) than primary turns ($n_1$) is defined as a step-up transformer and, alternatively, a transformer with $n_1 > n_2$ is defined as a step-down transformer, where for either case $V_{OUT}/V_{IN} = n_2/n_1$. Unlike conventional transformers, the planar geometry of the present monolithic transformer structure will cause variations in $V_{OUT}/V_{IN}$ from the ideal $n_2/n_1$ ratio. In particular, as more turns are added to either the primary or secondary, the ratio $V_{OUT}/V_{IN}$ will fall off slightly from the ideal $n_2/n_1$. However, the use of the formula, written as $V_{OUT}/V_{IN} \alpha\ n_2/n_1$, may be used as a guide in designing a monolithic transformer structure in accordance with the present invention. FIG. 3 illustrates a cut away side view of an integrated step-up transformer arrangement 30, similar to transformer 10 of FIG. 1, with the exception that a secondary winding 32 of transformer 30 comprises three separate, planar turns denoted 34, 36 and 38. For the embodiment of FIG. 3, each turn is illustrated as having a width of 10 $\mu$m, with a spacing of 10 $\mu$m between adjacent planar turns. Secondary winding 32 is formed such that turns 34, 36, and 38 lie above primary winding 12 so as to provide the most complete coupling of signal between the primary and secondary. A top view of this arrangement is shown in FIG. 4, where the three separate turns 34, 36 and 38 of secondary winding 32 are clearly visible. Obviously, the roles of primary and secondary may be reversed to form a step-down transformer, with $V_{IN}$ applied to winding 32 and $V_{OUT}$ induced in winding 12.

Figure 5:
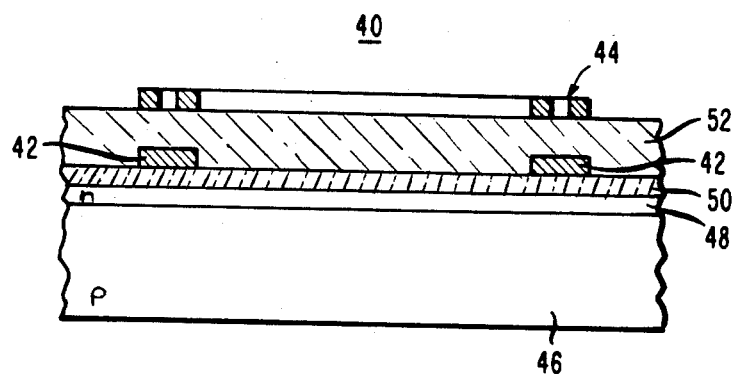
FIG. 5 illustrates a partial side view of yet another embodiment of the present invention formed with junction isolated processing techniques with a two-turn secondary transformer winding.

As was mentioned above, it is also possible to form an integrated transformer structure of the present invention using junction isolated processing techniques. FIG. 5 illustrates a side view of an exemplary transformer 40 formed using this technique. Transformer 40 is illustrated as comprising a single turn primary winding 42 and a two turn secondary winding 44. For this arrangement, transformer 40 may be formed in a conventional junction isolated process, where the starting material for such an exemplary process may be p-type substrate 46. An n-type epitaxial layer 48 is then formed to cover the top surface of substrate 46 and a dielectric layer 50 is grown to cover epitaxial layer 48. Primary winding 42 is then formed over dielectric layer 50, where primary 42 comprises any conductive material suitable for use in the manufacture of bipolar circuits, one material being layers of titanium and platinum. Conventional patterning techniques are utilized to form as many planar turns as desired for primary 42. As stated above, primary 42 in this particular exemplary comprises only a single turn.

Isolation between primary 42 and secondary 44 is provided by a thick isolation region 52, where isolation region 52 may comprises silicon nitride, or any other insulating material compatible with bipolar circuit processing. An advantage of this arrangement over those previously discussed is that isolation region 52 may be made substantially thicker than the $SiO_2$/p-glass combination discussed above and thus provide isolation at least an order of magnitude greater than the dielectrically isolated embodiments. This is due to the fact that the thickness of dielectric isolation region 22, as illustrated in FIG. 1, needs to track in thickness with dielectric region 16 to provide the required isolation and thus become unwieldy in manufacturing for extremely high voltage applications.

Referring back to FIG. 5, secondary winding 44 is then formed utilizing similar techniques as used to form primary winding 42 and, likewise, comprises any suitable conductive material, layers of titanium, platinum and gold being one such material. Exemplary thicknesses for the various layers forming transformer 40 are shown in FIG. 5 for the sake of illustration only. It is to be understood that various other combinations of thicknesses may also be utilized, in particular with respect to the thickness of dielectric region 52, to provide the required isolation.

Figure 6:
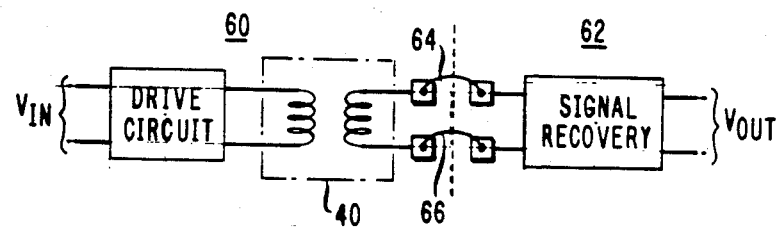
FIG. 6 is a block diagram of a packaged two-chip transformer arrangement formed as illustrated in FIG. 5, where the transformer is fully integrated in one of the two chips.

A problem with the embodiment illustrated in FIG. 5, however, is the limited breakdown voltage of the isolation junctions, where the application of a sufficiently large voltage between the circuitry of primary 42 and secondary 44 will cause the isolation junction to breakdown and begin conducting. Therefore, to isolate transformer 40 from additional circuitry formed in substrate 46 (for example, signal recovery circuitry coupled to secondary 44) the complete chip which includes all of the components is sliced vertically into two pieces—a first piece 60 containing transformer 40 and a second piece 62 containing the signal recovery circuitry. Wirebonds 64 and 66 are then used to reconnect transformer secondary 44 to the circuitry and epoxy is used to fill the air gap between chips. FIG. 6 contains a block diagram illustrating this technique. Since the distance separating the two chips is essentially negligible, both pieces can be packaged together in any conventional package standard in the art. This particular embodiment of an integrated transformer arrangement of the present invention, while not being as completely monolithic (in relation to the inclusion of recovery circuitry with the transformer) as the other arrangements described above, still utilizes a fully integrated transformer structure and as such is significantly smaller than any other known prior art transformer structure.

What is claimed is:

1. An integrated transformer structure comprising
   a semiconductor substrate of a first conductivity type defined as including top and bottom major surfaces;
   a primary winding comprising a planar spiral configuration of a low resistivity material formed in said top major surface of said substrate;
   an insulating region disposed to cover said top major surface including said primary winding; and
   a secondary winding comprising a planar spiral configuration of a low resistivity material formed over said insulating region in a manner such that said secondary winding is disposed above said primary winding.

2. An integrated transformer structure as defined in claim 1 wherein the insulating region comprises
   a first insulating layer disposed to cover the top major surface of the substrate; and
   a second insulating layer disposed to cover said first insulating layer.

3. An integrated transformer structure as defined in claim 2 wherein the first insulating layer comprises silicon dioxide and the second insulating layer comprises phosphorous-doped silicon.

4. An integrated transformer structure as defined in claim 1 wherein the insulating region comprises a layer of silicon nitride.

5. An integrated transformer structure as defined in claims 1 or 2 wherein the primary winding spiral comprises a single turn and the secondary winding spiral comprises a single turn.

6. An integrated transformer structure as defined in claims 1 or 2 wherein the primary winding spiral comprises a single turn and the secondary winding spiral comprises more than one turn.

7. An integrated transformer structure as defined in claims 1 or 2 wherein the primary winding spiral comprises more than one turn and the secondary winding spiral comprises a single turn.

8. An integrated transformer structure as defined in claims 1 or 2 wherein the primary winding spiral comprises more than one turn and the secondary winding spiral comprises more than one turn.

9. An integrated transformer structure as defined in claims 1 or 2 wherein the primary winding material comprises n-doped polysilicon.

10. An integrated transformer structure as defined in claim 9 wherein a dielectric layer is utilized to separate the primary winding from the substrate.

11. An integrated transformer structure as defined in claims 1 or 2 wherein the secondary winding material comprises aluminum.

12. An integrated transformer structure as defined in claim 1 wherein the primary winding material comprises titanium and platinum, the insulating region comprises a layer of silicon nitride, and the secondary winding material comprises titanium, platinum, and gold.

* * * * *